United States Patent

Endo et al.

[11] Patent Number: 6,049,074
[45] Date of Patent: Apr. 11, 2000

[54] PHOTOELECTRIC CONVERSION DEVICE

[75] Inventors: Tadao Endo; Akira Funakoshi, both of Atsugi; Akira Tago, Utsunomiya; Shinichi Takeda, Atsugi; Eiichi Takami, Chigasaki; Masakazu Morishita, Hiratsuka; Shinichi Hayashi, Ebina; Chiori Mochizuki, Sagamihara; Toshikazu Tamura, Utsunomiya; Minoru Watanabe, Odawara, all of Japan

[73] Assignee: Canon Kabushiki Kaisha, Tokyo, Japan

[21] Appl. No.: 09/379,630

[22] Filed: Aug. 24, 1999

Related U.S. Application Data

[62] Division of application No. 09/107,283, Jun. 30, 1998, Pat. No. 5,965,872, which is a division of application No. 08/803,106, Feb. 20, 1997, Pat. No. 5,811,790.

[30] Foreign Application Priority Data

Feb. 22, 1996 [JP] Japan .................................. 8-034904
Feb. 12, 1997 [JP] Japan .................................. 9-027838

[51] Int. Cl.$^7$ .............................. H01L 27/00; H01J 35/10
[52] U.S. Cl. ........................................ 250/208.1; 257/712
[58] Field of Search ........................... 250/208.1, 484.2; 257/469, 706, 707, 712, 720; 378/28, 141–143; 358/471

[56] References Cited

U.S. PATENT DOCUMENTS

| | | | |
|---|---|---|---|
| 4,763,344 | 8/1988 | Piestrup | 378/119 |
| 5,281,803 | 1/1994 | Ishizuka | 250/208 |
| 5,352,883 | 10/1994 | Kitani et al. | 250/208.1 |
| 5,475,211 | 12/1995 | Ogura et al. | 250/208.1 |
| 5,556,716 | 9/1996 | Herron et al. | 428/688 |
| 5,596,228 | 1/1997 | Anderton et al. | 257/714 |
| 5,637,921 | 10/1997 | Burwald-Hoy | 257/712 |
| 5,689,542 | 11/1997 | Lavering et al. | 378/142 |
| 5,811,790 | 9/1998 | Endo et al. | 250/208 |
| 5,903,052 | 5/1999 | Chen et al. | 257/706 |
| 5,965,872 | 10/1999 | Endo et al. | 250/208.1 |

*Primary Examiner*—Stephone B. Allen
*Attorney, Agent, or Firm*—Fitzpatrick, Cella, Harper & Scinto

[57] ABSTRACT

In a photoelectric conversion device including peripheral ICs, the peripheral ICs are in thermal contact with a substrate having photoelectric conversion elements and a chassis, which covers the peripheral ICs and has high thermal conductivity, via a thermal conductive member, so as to eliminate adverse influences of heat produced by the peripheral ICs such as a low S/N ratio.

4 Claims, 12 Drawing Sheets

PHOTOELECTRIC CONVERSION DEVICE

This is a divisional application of application Ser. No. 09/107,283, filed Jun. 30, 1998, now U.S. Pat. No. 5,965,872, which is a divisional of Ser. No. 08/803,106 filed Feb. 20, 1997, now U.S. Pat. No. 5,811,790.

BACKGROUND OF THE INVENTION

1. Field of the Invention

The present invention relates to a photoelectric conversion device and, more particularly, to a photoelectric conversion device which is suitably used in a radiophotographic apparatus such as a medical, digital X-ray imaging apparatus with a large area and high S/N characteristics.

2. Related Background Art

Not only in Japan in which the population of elderly people is increasing rapidly but also worldwide, improvement of diagnostic efficiency in hospitals and development of medical equipments with higher precision are strongly demanded. In such situation, an X-ray imaging apparatus using a film (film type apparatus) has been popularly used.

FIG. 1 is a schematic view showing the arrangement for explaining an example of a conventional film type X-ray imaging apparatus. In FIG. 1, an X-ray source 901 is arranged above an object 902 to be inspected (to be examined) such as a human body (patient), and a grid 903 is arranged beneath the object 902 to be inspected. The grid 903 is constituted by alternately arranging a substance that absorbs X-rays and a substance that transmits X-rays so as to increase the resolution. A scintillator (phosphor) 904 absorbs X-rays and emits visible rays. The visible rays emitted by the scintillator 904 are received by a film 905.

Such film type apparatus has the following problems.

Before a doctor acquires an X-ray image of a patient, a film development process must be performed, resulting in much labor and time.

Sometimes, when a patient moves during X-ray phototaking or when the exposure amount is improper, phototaking must be inevitably redone. These factors impede improving diagnostic efficiency in hospitals.

A clear X-ray image cannot often be obtained depending on the phototaking angle of the affected portion to be phototaken. For this reason, in order to obtain an X-ray image required for diagnosis, some images must be taken while changing the phototaking angle. Such operation is not preferred especially when the patient is an infant or a pregnant woman.

Furthermore, X-ray image films must be preserved after phototaking for a certain period of time in hospitals, and the number of such films becomes very large in hospitals, resulting in poor efficiency in terms of management in such institutions since the films must be put in and out every time a patient comes to a hospital.

When a patient needs to change the hospital he or she normally visits to seek medical attention for some reason, for example, when a patient in a remote place must undergo diagnosis as highly advanced as that he or she can receive only in a midtown university hospital or must move abroad, X-ray films after exposure and development must be delivered to the next hospital by some method. Otherwise, the patient must be subjected to phototaking again in the new hospital. These problems are serious obstacles against establishing a new system of medical practice in future.

In recent years, in medical industries, demand for "digitization of X-ray image information" is increasing. If the digitization is attained, X-ray image information can be managed using recording media such as magneto-optical disks, and a doctor can acquire X-ray image information at an optimal angle in real time. When communication systems such as a facsimile system, and the like are utilized, X-ray image information can be sent to hospitals everywhere in the world within a short period of time. Furthermore, when the obtained digital X-ray image information is subjected to image processing using a computer, diagnosis with higher precision than in the conventional method can be realized, and all the problems that the conventional film method has encountered can be solved.

Recently, an X-ray imaging apparatus that uses a CCD solid-state imaging element in place of a film has also been proposed to meet demand for "digitization of X-ray image information". For this reason, when a CCD solid-state imaging element is used, fluorescence, i.e., an X-ray image, from the scintillator must be imaged on the CCD light-receiving surface via a reduction optical system. This poses a problem of an increase in scale of the X-ray imaging apparatus. On the other hand, since an X-ray image is formed via a lens, it is generally accepted that the S/N (signal to noise) ratio is reduced by two to three orders upon passing through the lens, and this fact is expected to be disadvantageous upon applying the CCD solid-state imaging element to medical equipment that require high gradation characteristics.

In recent years, upon development of photoelectric conversion semiconductor thin films represented by hydrogenated amorphous silicon (to be abbreviated as a-Si hereinafter), so-called contact sensors which are constituted by forming photoelectric conversion elements on a large-area substrate and can attain reading by an optical system at an equal magnification to an information source have been developed extensively. In particular, since a-Si can be used not only as a photoelectric conversion material but also a thin film field effect transistor (to be abbreviated as a TFT hereinafter), photoelectric conversion semiconductors and a semiconductor layer of TFTs can be simultaneously formed on a single substrate. Since the surface area can be increased so that an image can be read at an equal magnification without using a reduction magnification system, the S/N ratio can be higher than that of the CCD solid-state imaging element. In addition, since the necessity of the reduction optical system can be obviated, a size reduction of the apparatus can be promoted, and such apparatus is effective for a small medical institution that cannot assure a large space, a diagnosis vehicle that carries an X-ray imaging apparatus, and the like. Owing to these merits, X-ray imaging apparatuses using an a-Si semiconductor thin film have been extensively developed. More specifically, an X-ray imaging apparatus in which photoelectric conversion elements and TFTs using the a-Si semiconductor thin film replace the film portion 905 in FIG. 1, and which electrically reads an X-ray, image has been developed.

The X-ray dose on human bodies has an upper limit in hospitals although it varies depending on the affected portions. In particular, in diagnosing an infant or a pregnant woman, the dose must be reduced as much as possible. Therefore, in general, the light-emission amount of a scintillator (phosphor) that absorbs X-rays and converts them into visible rays, and the charge amount in an a-Si photoelectric conversion element which receives fluorescence and photoelectrically converts it are small. In order to obtain a clear image from a weak signal, wiring lines must be shortened as much as possible so as to prevent noise components from superposing on analog signal wiring lines extending from a photoelectric conversion panel, and an analog signal must be received by a buffer amplifier to decrease the impedance. Furthermore, in order to eliminate the influence of noise, the analog signal is preferably A/D-converted in the vicinity of the buffer amplifier to store digital data in a memory.

When a digital X-ray imaging apparatus is constituted using a photoelectric conversion panel on which photoelectric conversion elements having an a-Si semiconductor thin film are arranged two-dimensionally, it is generally accepted that the pixel pitch is preferably set to be 100 μm or less in terms of resolution. Also, for chest x-rays of a person, it is generally accepted that the effective pixel area of the photoelectric conversion elements preferably has at least a size of 400 mm×400 mm. When a photoelectric conversion panel having an effective area of 400 mm×400 mm is formed at 100-μm pitch, the number of pixels is as large as 16 million. When photoelectric conversion signals from such large number of pixels are processed, buffer amplifier ICs and A/D-conversion ICs must operate at high speed. In particular, when moving images are to be phototaken, higher-speed processing is required, and each IC requires large consumption power. When a large volume of digital data are to be transmitted to a remote place outside an X-ray phototaking room at high speed, since a high-speed type line driver required for removing transmission errors comprises an IC mainly constituted by bipolar transistors, it requires larger consumption power as higher-speed specifications are attained, and becomes an insignificant heat generation source.

In recent years, high-speed CMOS-ICs with small consumption power have been developed remarkably, and their further advance in future is expected. However, as far as the versatile ICs are concerned, the performance of such CMOS-IC cannot compare with that of ICs using bipolar transistors. As a consequence, ICs mainly constituted by high-speed bipolar transistors must be used, and heat produced by ICs themselves upon increase in consumption power has a serious influence on an X-ray imaging apparatus.

Heat produced by an IC raises the temperatures of a-Si photoelectric conversion elements and TFTs in the X-ray imaging apparatus. In general, dark currents and photocurrents in a-Si photoelectric conversion elements change in correspondence with the temperature rise. Since changes in dark current produce temperature differences in the two-dimensional array of photoelectric conversion elements, dark currents may vary in the plane to impose an adverse influence in the form of fixed pattern noise (FPN). Also, shot noise in the photoelectric conversion elements may impose an adverse influence in the form of random noise (RDN). Furthermore, the temperature unevenness of the photoelectric conversion elements upon reading may induce in-plane shading in the output. Moreover, so-called KTC noise (K: Boltzmann's constant, T: absolute temperature, C: capacity in transfer system) is produced upon transferring accumulated signal charges from the photoelectric conversion elements, and may inflict an adverse influence (RDN). The above-mentioned temperature rise of the photoelectric conversion elements and TFT induces a decrease in S/N ratio of the X-ray imaging apparatus and variations in S/N ratio among pixels, thus deteriorating image quality. In addition, the reliability of the apparatus may be impaired.

However, since all the X-rays are not always converted into visible rays in the phosphor, some scattered or transmitted X-rays are radiated onto the above-mentioned buffer amplifier, memory, or other digital ICs in the vicinity of the photoelectric conversion panel. Such X-rays deteriorate the performance of ICs formed by crystalline Si, and the apparatus may malfunction over a long term of use, thus posing the problem of reliability. For this reason, in addition to the above-mentioned problems, it is desired to take a measure against exposure of unwanted portions to X-ray radiation.

Such problems may be posed not only in the photoelectric conversion device used in the X-ray imaging apparatus but also in a large-area, multiple-pixel photoelectric conversion device which can convert light information into electrical information.

Also, similar problems may be posed not only in a photoelectric conversion device for an imaging apparatus which uses radiation such as X-rays as a light source, but also in a photoelectric conversion device which is used in non-destructive inspections to realize high-speed processing and a high-resolution, large-area structure.

SUMMARY OF THE INVENTION

It is an object of the present invention to solve the problem that a high-quality read image cannot be obtained due to a low S/N ratio as a result of the temperature rise of a photoelectric conversion element (e.g., an element having an a-Si semiconductor layer) and a switching element (e.g., a TFT) caused by heat produced by a high-speed IC required for processing a huge number of pixels.

It is another object of the present invention to solve the problem of low reliability caused by temperature rises in the apparatus.

It is still another object of the present invention to realize a photoelectric conversion device in which ICs are integrally built in peripheral circuits and which can eliminate adverse influences of heat produced by the ICs in the peripheral circuits.

It is still another object of the present invention to solve the problems of low performance and malfunctions in long-term use of ICs consisting of crystalline Si caused by exposure of the ICs to X-ray radiation.

It is still another object of the present invention to provide a photoelectric conversion device comprising:

photoelectric conversion means for receiving light that carries information and photoelectrically converting the light into an electrical signal;

an integrated circuit element (IC) for processing the electrical signal converted by the photoelectric conversion means; and a housing which accommodates the photoelectric conversion element and the integrated circuit element, wherein a thermal conductive member for thermally connecting the integrated circuit element and the housing is interposed between the integrated circuit element and the housing.

It is still another object of the present invention to provide a photoelectric conversion device comprising at least:

a phosphor for absorbing radiation and emitting light;

photoelectric conversion means for receiving the light emitted by the phosphor and photoelectrically converting the light into an electrical signal;

an IC for processing the electrical signal converted by the photoelectric conversion means;

a metal chassis for integrally holding the respective members and transmitting the radiation; and a member with a high thermal conductivity, which is interposed between at least a portion of the IC and the chassis and/or the radiation absorbing member.

It is still another object of the present invention to provide a photoelectric conversion device constituted by at least a phosphor for absorbing radiation and emitting visible rays, a two-dimensional array of a plurality of photoelectric conversion elements for receiving fluorescence emitted by the phosphor and photoelectrically converting the fluorescence, a switching element for switching signals from the photoelectric conversion elements, an IC for driving the photoelectric conversion elements and the switching element, an IC for reading the signals from the photoelectric conversion elements, an IC (A/D, CPU, memory, etc.) for processing the signal from the IC, a line driver IC for transmitting processing data to a remote place, a radiation absorbing member interposed between the photoelectric conversion elements and the plurality of types of ICs, and a metal chassis which mechanically holds these components and does not absorb any radiation, wherein portions of the plurality of types of ICs contact the radiation absorbing member (lead plate) or the chassis directly or via a member such as heat-dissipation silicone-based grease having a high thermal conductivity.

It is still another object of the present invention to provide a photoelectric conversion device with built-in peripheral ICs, in which the peripheral ICs thermally contact a chassis, which has high heat dissipation characteristics, and covers a substrate having photoelectric conversion elements and the peripheral ICs, via a thermal conductive member, so as to eliminate an adverse influence of heat produced by the peripheral ICs such as problems of a low S/N ratio, and the like.

DETAILED DESCRIPTION OF THE PREFERRED EMBODIMENTS

A preferred example of photoelectric conversion elements that can be applied to a photoelectric conversion device of the present invention will be explained below.

Figure 1:
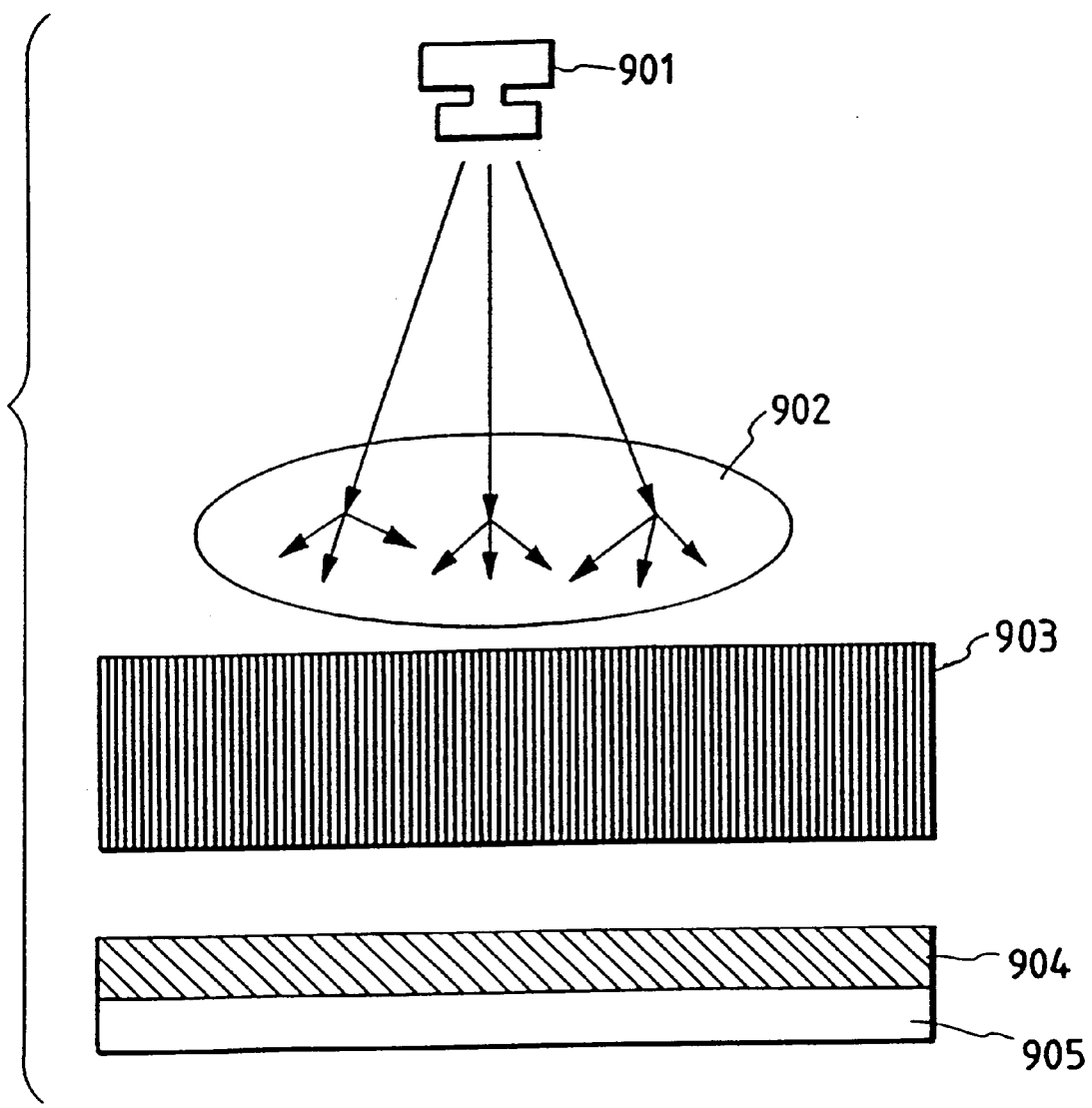
FIGS. 1 and 11 are schematic views for explaining examples of an X-ray imaging apparatus.
Figure 2:
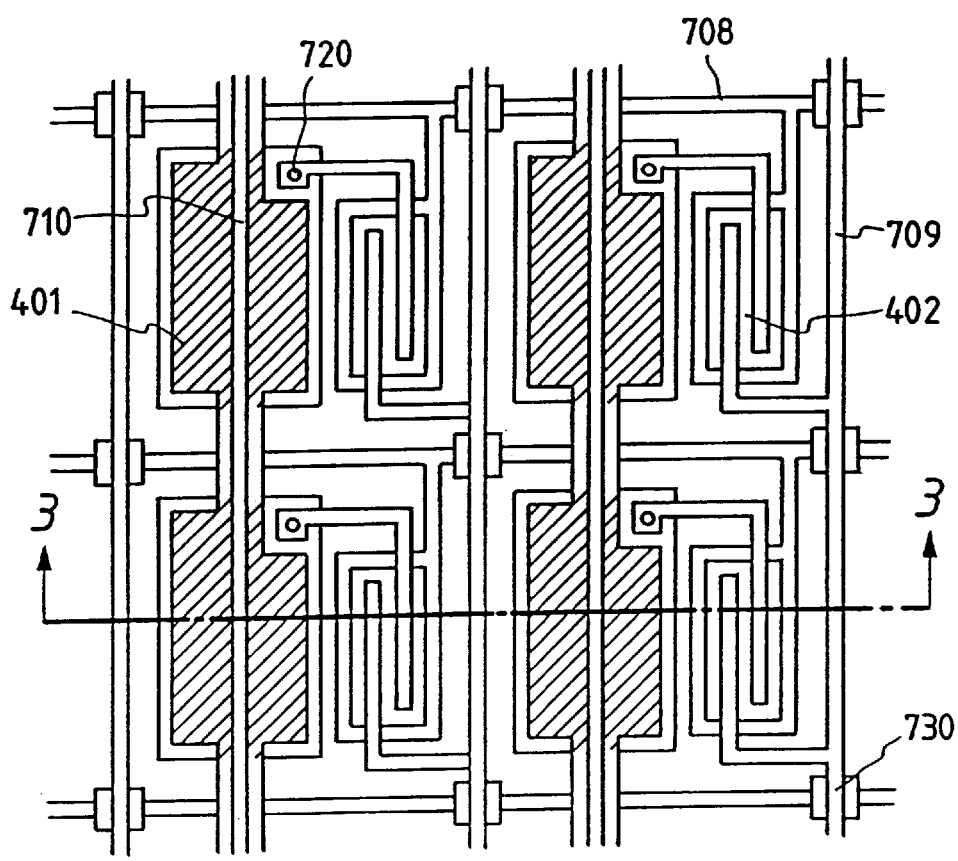
FIG. 2 is a plan view for explaining an example of the reading region of a photoelectric conversion device.

FIG. 2 is a plan view showing photoelectric conversion elements 401 and switching elements 402 for four pixels in a portion of a two-dimensional photoelectric conversion device. In FIG. 2, the hatched portions correspond to regions which serve as light-receiving surfaces for receiving, e.g., fluorescence from a scintillator. Each switching element 402 transfers a signal charge photoelectrically converted by the corresponding photoelectric conversion element 401 toward the processing circuit side, and is controlled by a signal on a control line 708. Each switching element 402 is connected to the processing circuit via a signal line 709. Each contact hole 720 connects the corresponding pair of photoelectric conversion element 401 and switching element 402.

Figure 3:
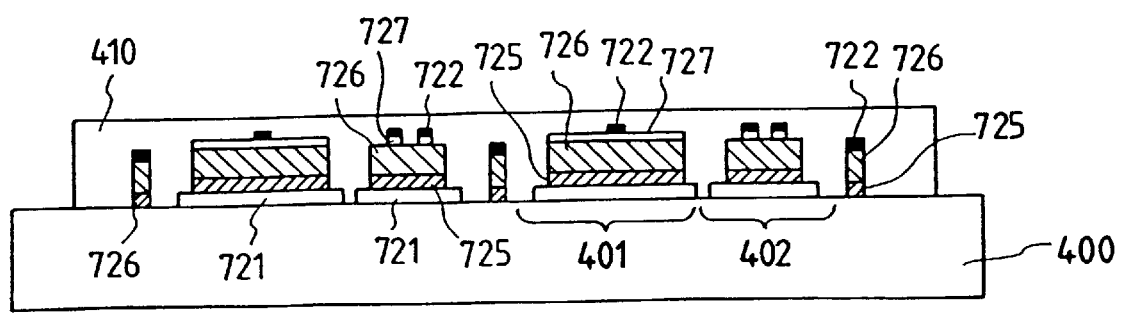
FIG. 3 is a sectional view for explaining an example of the reading region of the photoelectric conversion device.

FIG. 3 is a sectional view of the photoelectric conversion device in FIG. 2 taken along a line 3—3 in FIG. 2. FIG. 3 depicts a substrate 400, a protection layer 410, a first metal thin film 721, a second metal thin film 722, an insulating layer 725, a semiconductor layer 726, and an ohmic contact layer 727. An example of the method of forming the depicted photoelectric conversion device portion will be explained below.

A chromium (Cr) film having a thickness of about 500 Å is deposited by sputtering or resistive heating on the substrate 400, at least the surface of which has insulating characteristics, and is patterned by photolithography to etch unnecessary areas, so as to form a first metal thin film layer 721. The first metal thin film layer 721 serves as the lower electrode of each photoelectric conversion element 401 and the gate electrode of each switching element 402. A 2,000-Å thick insulating layer 725 (a-SiN$_x$), a 5,000-Å thick semiconductor layer 726 (a-Si:H, an amorphous material consisting mainly of silicon atoms and doped with a hydrogen atom), and a 500-Å thick ohmic contact layer 727 (n$^+$-layer) are stacked in turn by CVD in an identical vacuum atmosphere. These layers respectively correspond to an insulating layer/photoelectric conversion semiconductor layer/hole injection blocking layer of each photoelectric conversion element 401, and also correspond to the gate insulating film/semiconductor layer/ohmic contact layer of each switching element 402 (TFT). Also, these layers are used as an insulating layer for cross portions (730 in FIG. 2) between the first and second metal thin films 721 and 722. The thicknesses of these layers are not limited to the above-mentioned values, but may be optimally designed in correspondence with the voltages, charges to be used in the photoelectric conversion device, the incident light amount (e.g., incident fluorescent amount from the scintillator), and the like. At least, the a-SiN$_x$ (an amorphous material having silicon and nitrogen atoms) layer preferably consists of a material, which can prevent passage of electrons and holes and can sufficiently assure the function of the gate insulating film of a TFT, and preferably has a thickness of 500 Å or more.

After these layers are stacked, areas that serve as contact holes (see 720 in FIG. 2) are dry-etched by RIE (Reactive Ion Etching), CDE (Chemical Dry Etching), or the like, and thereafter, an aluminum (Al) film having a thickness of about 10,000 Å is deposited as a second metal thin film 722 by sputtering or resistive heating. Furthermore, the deposited film is patterned by photolithography to etch unnecessary areas. The second metal thin film 722 serves as the upper electrode of each photoelectric conversion element 401, the source and drain electrodes of each switching TFT, other wiring lines (interconnects), and the like. When the second metal thin film 722 is formed, the upper and lower thin films are connected via the contact hole portions at the same time. Furthermore, in order to form a channel portion of each TFT, a portion between the source and drain electrodes is etched by RIE, and thereafter, unnecessary portions of the a-SiN$_x$ layer (insulating layer), a-Si:H layer (semiconductor layer), and n$^+$-layer (ohmic contact layer)

are etched to isolate the respective elements. In this manner, the photoelectric conversion elements 401, the switching TFTs 402, other wiring lines (708, 709, 710), and the contact hole portions 720 are formed.

FIG. 3 illustrates the elements for only two pixels, but a large number of pixels are simultaneously formed on the substrate 400, needless to say. Finally, for the purpose of improving humidity resistance, the elements and wiring lines are coated with an $SiN_x$ passivation film (protection film) 410. As described above, the photoelectric conversion elements, the switching TFTs, and the wiring lines are formed by only simultaneously stacking the common first metal thin film, a-$SiN_x$ layer, a-Si:H layer, $n^+$-layer, and second metal thin film layer, and etching these layers as needed. Only one injection block layer need only be formed in each photoelectric conversion element, and the above layers except for the metal thin films can be formed in an identical vacuum atmosphere.

The device operation of the photoelectric conversion element 401 alone will be explained below.

Figure 4A:
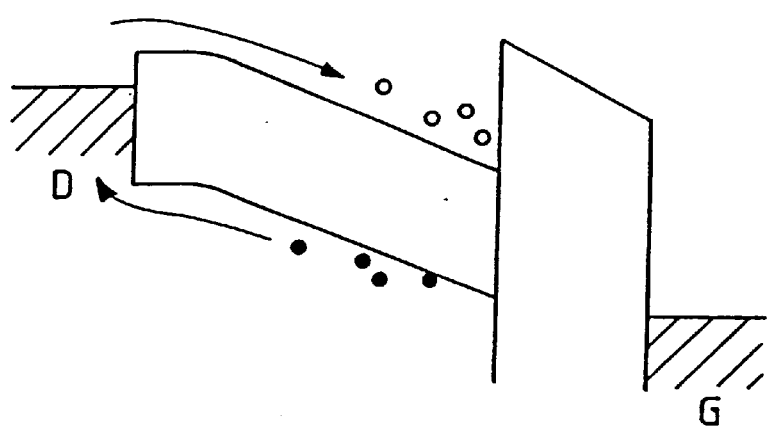
FIGS. 4A to 4C are energy band diagrams for explaining an example of the operation of a photoelectric conversion element.
Figure 4B:
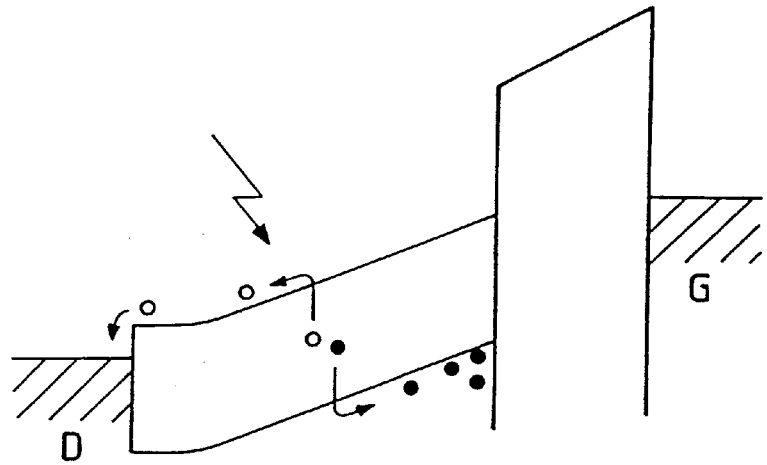

FIGS. 4A and 4B are schematic energy band diagrams showing the refresh mode and the photoelectric conversion mode of the photoelectric conversion element, and each show the state in the direction of thickness of the respective layers in FIG. 3. In FIG. 4A, a lower electrode 602 (to be referred to as a G electrode hereinafter) consists of Cr. An insulating layer 607 consists of SiN and blocks passage of both electrons and holes. The thickness of the layer 607 is set to be 500 Å or more that can prevent movement of electrons and holes due to the tunnel effect. A photoelectric conversion semiconductor layer 604 consists of an intrinsic (i-type) semiconductor layer of hydrogenated amorphous silicon (a-Si). An injection blocking layer 605 of an n-type a-Si layer doped with phosphorus or the like blocks injection of holes into the photoelectric conversion semiconductor layer 604. An upper electrode 606 (to be referred to as a D electrode hereinafter) consists of Al. In this embodiment, although the D electrode does not perfectly cover the n-layer, the D electrode and the n-layer always have the same potential to allow free movement of electrons between the D electrode and the n-layer, and the following description will be made under the assumption of this fact. The photoelectric conversion element of this embodiment performs two different operations, i.e., the refresh mode and the photoelectric conversion mode depending on the way of applying the voltage between the D and G electrodes.

In FIG. 4A that shows the refresh mode, the D electrode is applied with a negative potential with respect to the G electrode, and the holes indicated by full circles in the i-layer 604 flow toward the D electrode in the presence of an electric field. At the same time, the electrons indicated by open circles are injected into the i-layer 604. At this time, some holes and electrons recombine in the n-layer 605 and the i-layer 604 and disappear. If this state continues for a sufficiently long period of time, the holes in the i-layer 604 are wiped out from the i-layer 604.

In order to switch this state to the photoelectric conversion mode shown in FIG. 4B, a positive potential is applied to the D electrode with respect to the G electrode. Upon applying this voltage, the electrons in the i-layer 604 instantaneously flow to the D electrode. However, since the n-layer 605 serves as an injection blocking layer, holes never flow to the i-layer 604. In this state, when light enters the i-layer 604, the light is absorbed to generate electron-hole pairs. These electrons flow to the D electrode, and the holes move inside the i-layer 604 and reach the interface between the i-layer 604 and the insulating layer 607. However, since holes cannot move into the insulating layer 607, they stay in the i-layer 604. At this time, since the electrons move into the D electrode, and the holes move to the interface with the insulating layer 607 in the i-layer 604, a current flows from the G electrode to maintain an electrically neutral state. Since this current is proportional to the amount of electron-hole pairs produced by light, it is proportional to the incident light amount.

After the photoelectric conversion mode (FIG. 4B) is maintained for a predetermined period, when the element is switched to the refresh mode state (FIG. 4A), the holes staying in the i-layer 604 flow to the D electrode, as described above, and a current corresponding to these holes flows concurrently. The amount of holes corresponds to the total amount of light that is incident during the photoelectric conversion mode period. At this time, a current that corresponds to the amount of electrons injected into the i-layer 604 also flows. However, the amount of electrons is nearly constant, and can be subtracted from the amount of holes to detect the light amount. That is, the photoelectric conversion element of this embodiment can output the amount of incident light in real time, and at the same time, can output the total amount of light that enters the element within a predetermined period.

Figure 4C:
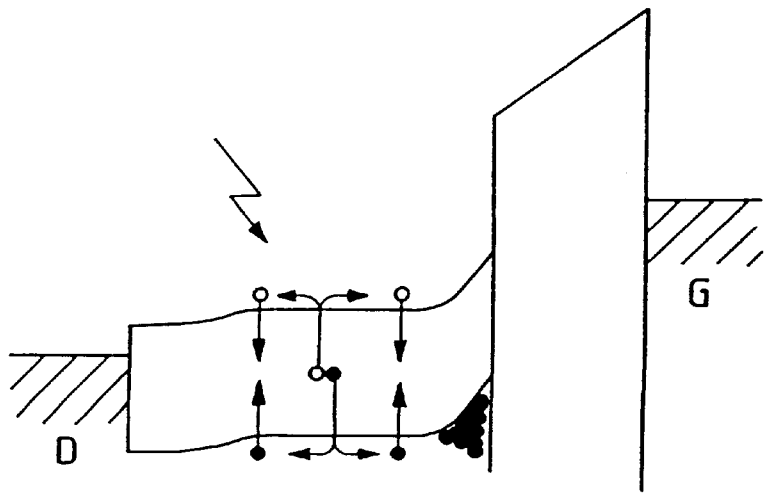

However, when the photoelectric conversion period is prolonged for some reason or when incident light has a strong illuminance, often no current flows although light is incident. Such phenomenon occurs for the following reason. That is, as shown in FIG. 4C, a large number of holes stay in the i-layer 604, these holes reduce the electric field in the i-layer 604, and the produced electrons do not flow to the D electrode but recombine with holes in the i-layer 604. When the incident state of light changes in this state, a current flows unstably, but when the refresh mode is set again, the holes in the i-layer 604 are wiped out, and a current proportional to light can be obtained in the next photoelectric conversion mode.

In the above description, when the holes in the i-layer 604 are wiped out in the refresh mode, it is ideal to wipe out all the holes, but it is effective to wipe out only some holes. In this case, a current equal to that obtained in the above case can be obtained, and no serious problem is posed. That is, the state shown in FIG. 4C need only be prevented at the detection timing in the next photoelectric conversion mode, and the potential of the D electrode with respect to the G electrode in the refresh mode, the duration of the refresh mode, and the characteristics of the injection blocking layer of the n-type layer 605 need only be determined.

Furthermore, in the refresh mode, injection of electrons into the i-layer 604 is not a necessary condition, and the potential of the D electrode with respect to the G electrode is not limited to a negative potential for the following reason. That is, when a large number of holes stay in the i-layer 604, even when the potential of the D electrode with respect to the G electrode is a positive potential, the electric field in the i-layer acts in a direction to move the holes to the D electrode. It is not a necessary condition for the characteristics of the injection blocking layer of the n-layer 605, either, that it be capable of injecting electrons into the i-layer 604.

Figure 5:
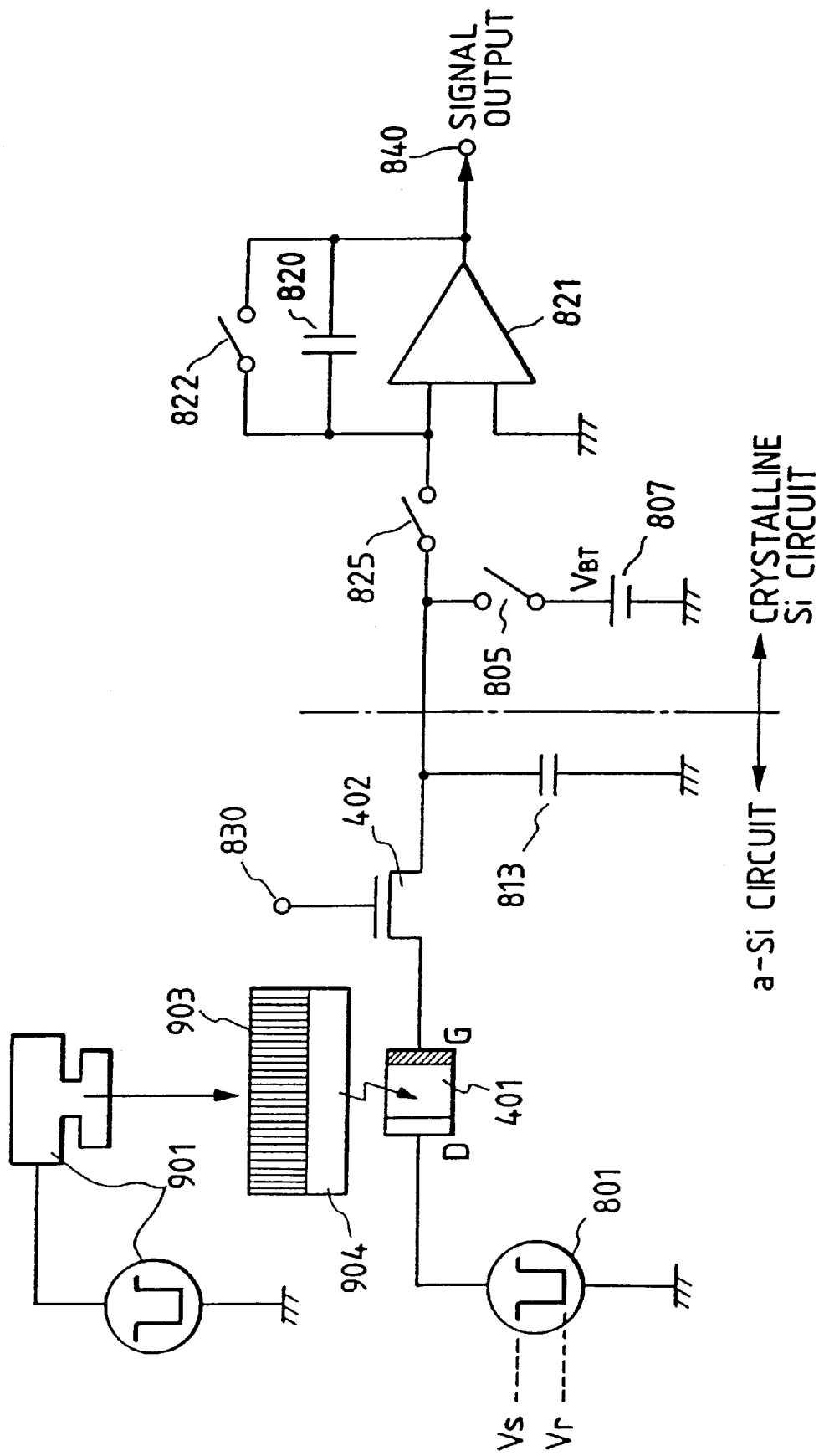
FIG. 5 is a schematic equivalent circuit diagram of the photoelectric conversion device.
Figure 6:
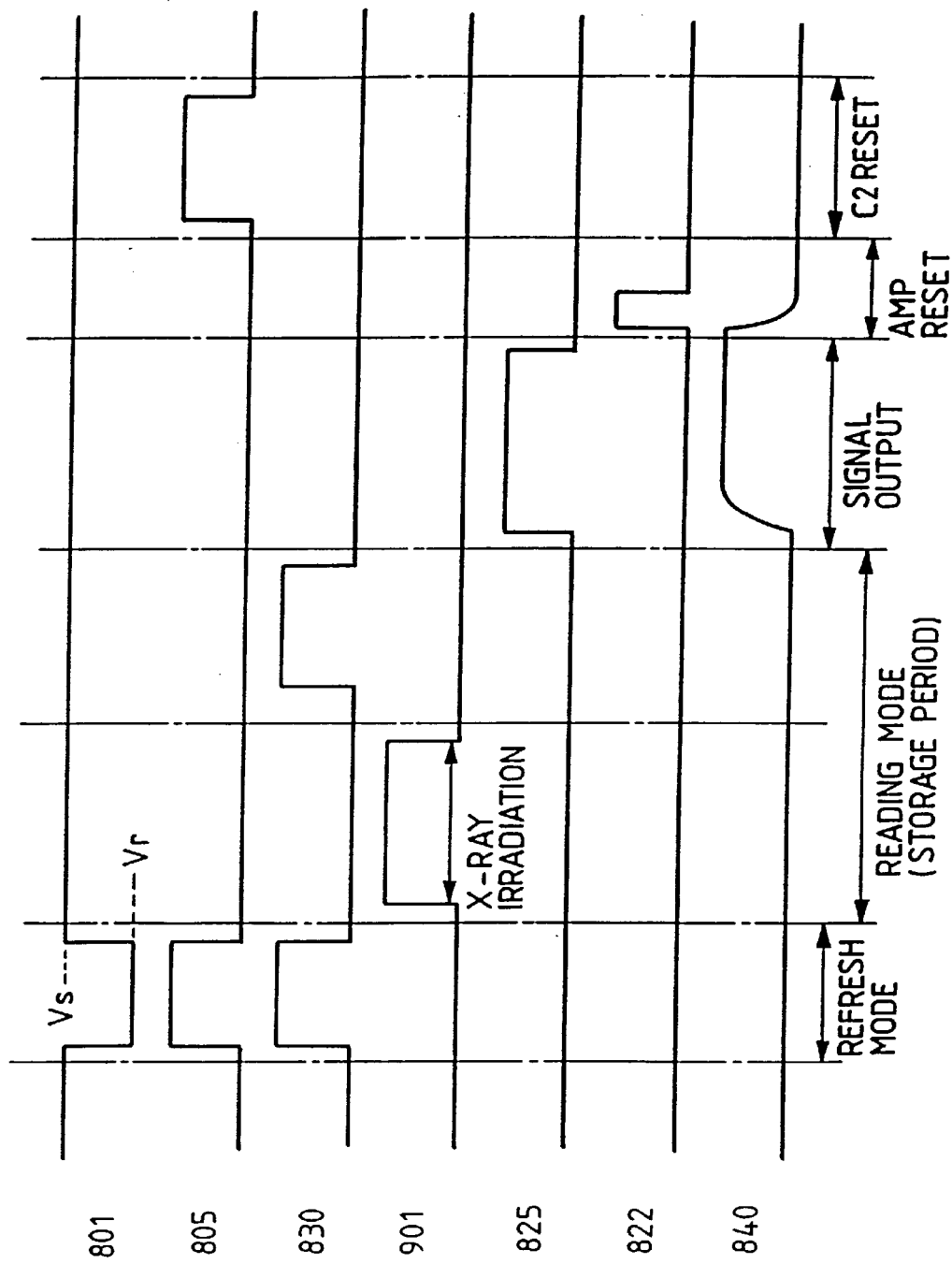
FIGS. 6 and 8 are timing charts for driving the photoelectric conversion device.

The operation of one pixel of the photoelectric conversion device in an X-ray imaging apparatus using the above-mentioned photoelectric conversion elements will be explained below with reference to FIGS. 5 and 6. FIG. 5 shows an example of an equivalent circuit including a photoelectric conversion element and a switching TFT for one pixel, and FIG. 6 shows an example of a timing chart showing its operation. In order to refresh the photoelectric conversion element 401, a gate Vg (830) and a reset switching element 805 are turned on while a bias power supply 801 is set to have a given voltage value (Vr). With this operation, the D electrode of the photoelectric conversion element 401 is refreshed to Vr, and its G electrode is refreshed to a bias $V_{BT}$ of a reset power supply 807 ($Vr<V_{BT}$). After this operation, the photoelectric conversion element is set in a storage state (reading mode). Thereafter, an X-ray source 901 is turned on, and X-rays transmitted through a human body and a grid 903 are irradiated onto a scintillator 904. Fluorescence produced by the scintillator 904 is irradiated onto and photoelectrically converted by the photoelectric conversion element 401. Since the a-SiN$_x$ insulating layer and a-Si:H photoelectric conversion semiconductor layer that constitute the photoelectric conversion element are also dielectrics, the photoelectric conversion element also serves as a capacitive element. That is, a signal charge photoelectrically converted by the photoelectric conversion element is stored in the photoelectric conversion element. Thereafter, the gate Vg of the TFT is turned on, and the signal charge in the photoelectric conversion element is transferred to a capacitive element 813. The capacitive element 813 is not formed as a specific element in FIG. 2, and is inevitably formed by the capacitance between the upper and lower electrodes of the TFT, the cross portion 730 between the signal line 709 and the gate line 708, or the like. Of course, the element 813 may be formed as a specific element in correspondence with the design intended. The above-mentioned operations are performed by an amorphous device formed on the insulating substrate except for power supply and gate control of the TFT. Thereafter, the signal charge in the capacitive element 813 is transferred to a capacitance 820 in a processing circuit by a switching element 825, and a signal is output via an operational amplifier 821. Thereafter, the capacitance 820 is reset by a switch 822, and the capacitive element 813 is reset by a switch 805, thus completing the operation for one pixel.

Figure 7:
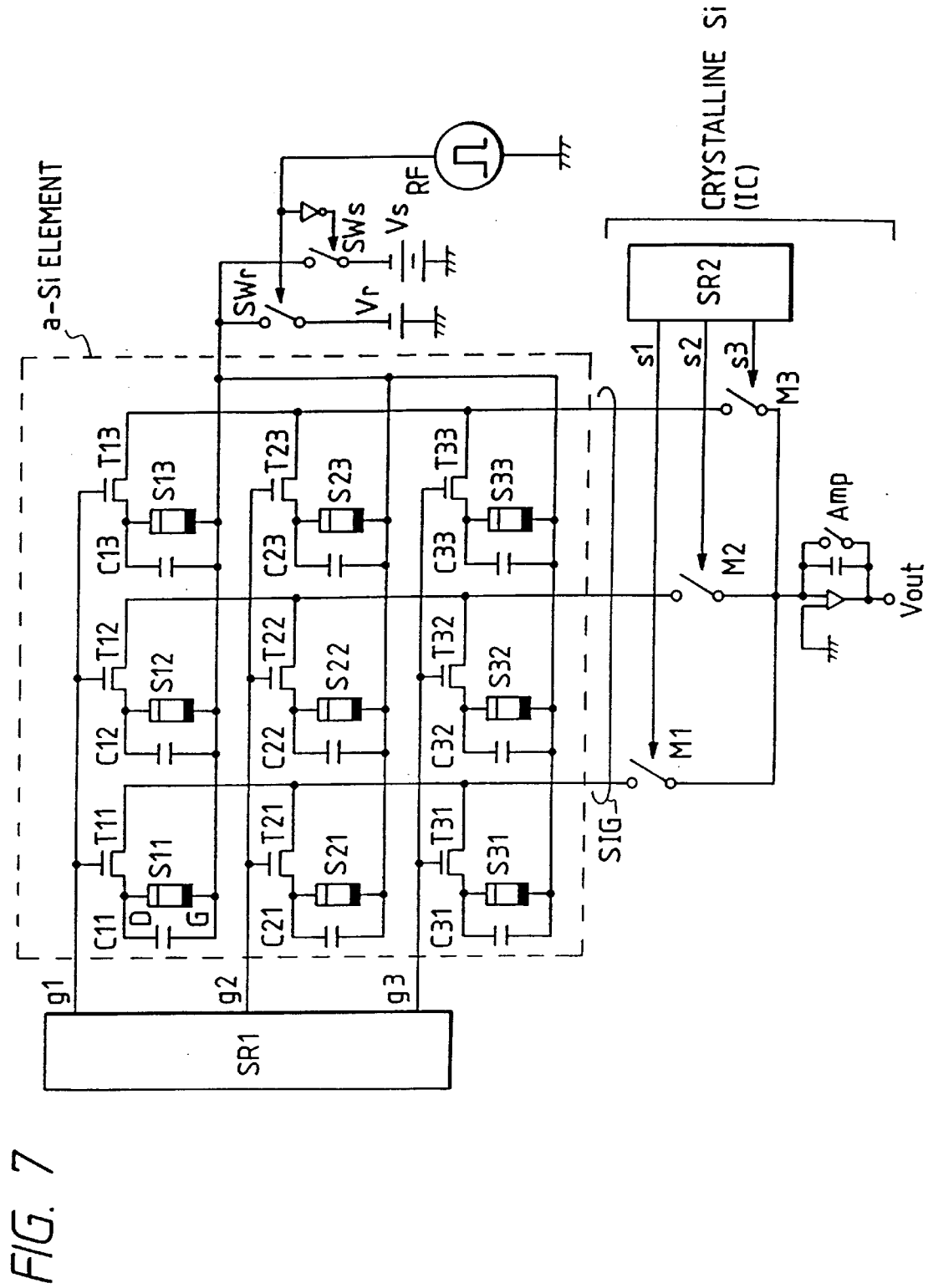
FIG. 7 is a schematic equivalent circuit diagram for explaining an example of a photoelectric conversion device having a two-dimensional reading unit.
Figure 8:
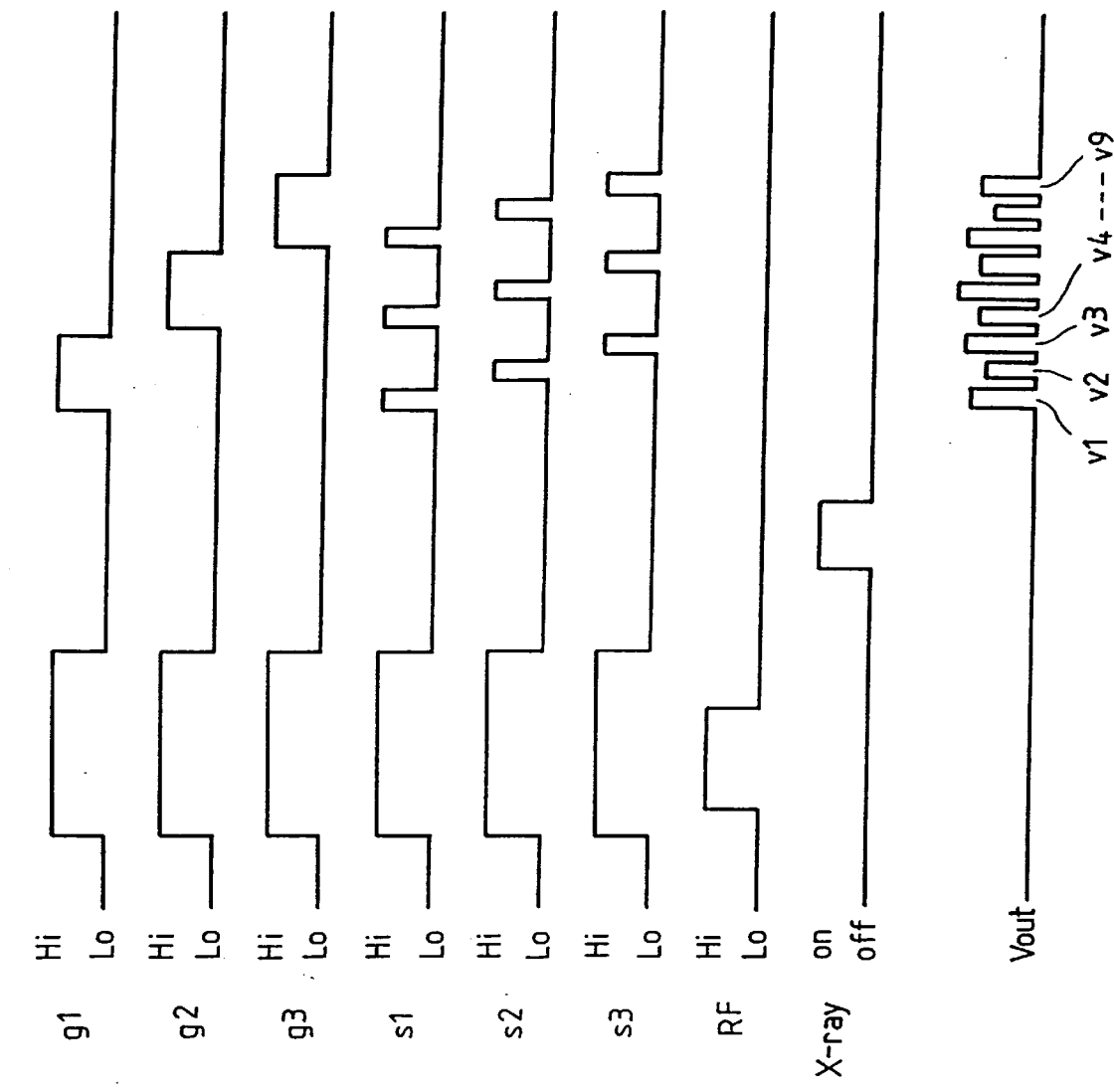

An example of the photoelectric conversion operation when the photoelectric conversion elements shown in FIG. 5 are two-dimensionally arranged in practice will be described below. FIG. 7 is an equivalent circuit diagram showing an example of the photoelectric conversion device obtained by two-dimensionally arranging the photoelectric conversion elements, and FIG. 8 is a timing chart showing an example of the operation of this device.

Referring to FIG. 7, photoelectric conversion elements S11 to S33, the lower electrode side of which is indicated by G and the upper electrode side of which is indicated by D, are connected to switching TFTs T11 to T33. A reading power supply Vs and a refresh power supply Vr are respectively connected to the D electrodes of all the photoelectric conversion elements S11 to S33 via switches SWs and SWr. The switch SWs is connected to a refresh control circuit RF via an inverter, and the switch SWr is directly connected to the circuit RF. The refresh control circuit RF controls these switches so that the switch SWr is turned on during the refresh period and the switch SWs is turned on during other periods. One pixel is constituted by one photoelectric conversion element and one switching TFT, and its signal output is connected to a detection integrated circuit IC via a signal line SIG. In this photoelectric conversion device, a total of nine pixels are divided into three blocks. The outputs from three pixels per block are simultaneously transferred, and are sequentially converted into outputs by the detection integrated circuit IC via the signal lines SIG, thus obtaining outputs (Vout). Three pixels in one block are arranged in the horizontal direction, and the three blocks are arranged in the vertical direction, thus arranging pixels two-dimensionally.

Initially, shift registers SR1 and SR2 apply Hi-level pulses to control lines g1 to g3 and signal lines s1 to s3. Then, the transfer switching TFTs T11 to T33 are electrically connected to switches M1 to M3, and the G electrodes of all the photoelectric conversion elements S11 to S33 are set at the GND potential (since the input terminal of an integration detector Amp is designed to have the GND potential). At the same time, the refresh control circuit RF outputs a Hi-level pulse to turn on the switch SWr, and the D electrodes of all the photoelectric conversion elements S11 to S33 are set to be a positive potential by the refresh power supply Vr. Then, all the photoelectric conversion elements S11 to S33 are set in the refresh mode and are refreshed. At the next timing, the refresh control circuit RF outputs a Lo-level pulse to turn on the switch SWs, and the D electrodes of all the photoelectric conversion elements S11 to S33 are set to be a positive potential by the reading power supply Vs. All the photoelectric conversion elements S11 to S33 are then set in the photoelectric conversion mode. In this state, the shift registers SR1 and SR2 apply Lo-level pulses to the control lines g1 to g3 and signal lines s1 to s3. In response to these pulses, the switches M1 to M3 of the transfer switching TFTs T11 to T33 are turned off, and the photoelectric conversion elements S11 to S33 hold potentials therein although the G electrodes of all the photoelectric conversion elements S11 to S33 are open in DC term since they also serve as capacitors. At this time, since no X-rays are incident, no light enters the photoelectric conversion elements S11 to S33, and no photocurrent flows. In this state, when X-ray pulses are output, and pass through the scintillator, fluorescence from the scintillator becomes incident on the photoelectric conversion elements S11 to S33. This fluorescence contains information concerning the internal structure of a human body. Photocurrents that flow in response to the incident light are stored as charges in the photoelectric conversion elements, and the charges are held after the end of incidence of X-rays. Then, when the shift register SR1 applies a Hi-level control pulse to the control line g1, and the shift register SR2 applies control pulses to the signal lines s1 to s3, outputs v1 to v3 are sequentially output via the transfer switching TFTs T11 to T13 and the switches M1 to M3. Similarly, other optical signals are sequentially output under the control of the shift registers SR1 and SR2. With these signals, two-dimensional information of the internal structure of, e.g., a human body are obtained as the outputs v1 to v9. A still image is obtained by the operations described so far. However, when a moving image is to be obtained, the operations described so far are repeated.

Figure 9:
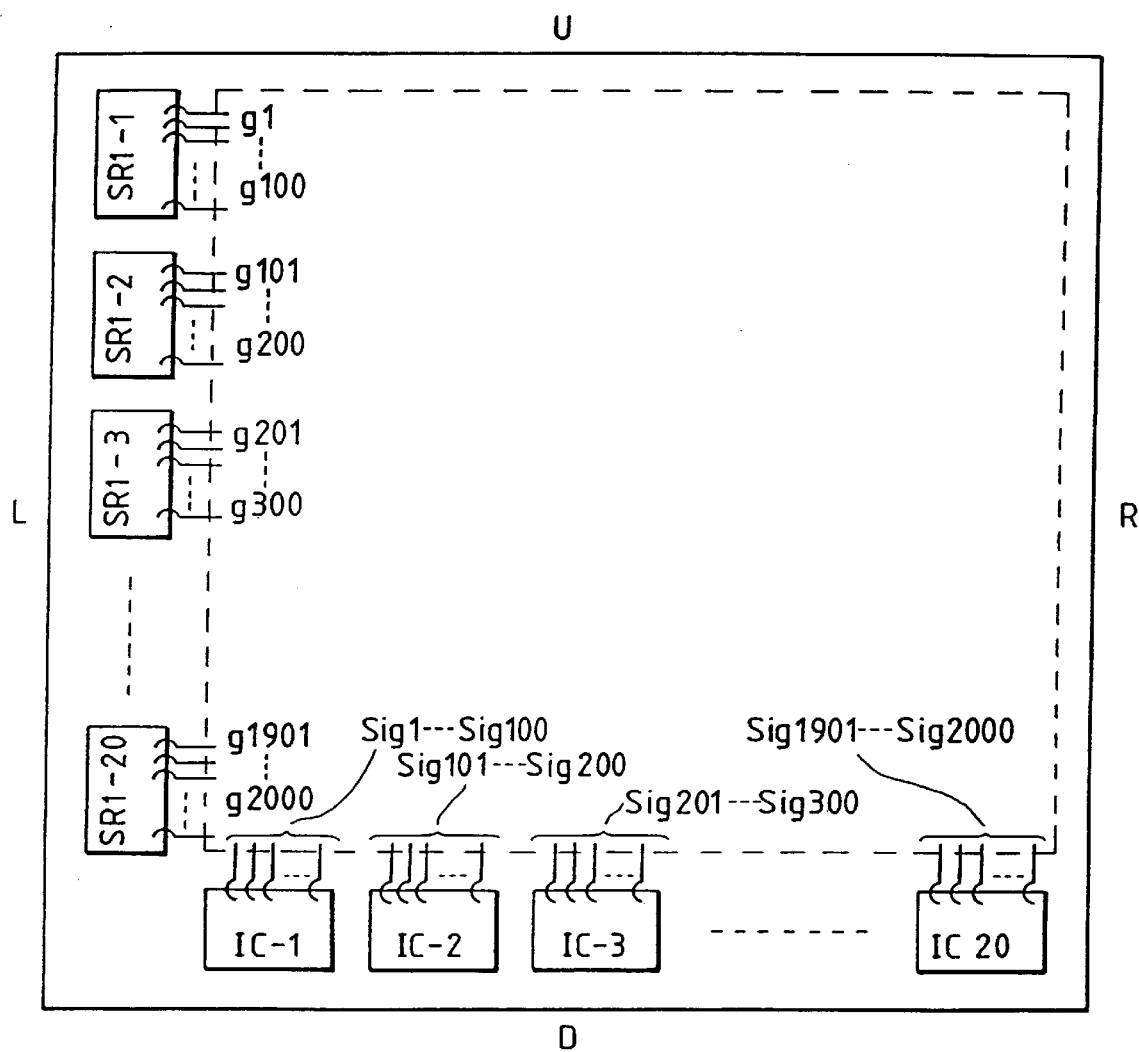
FIG. 9 is a plan view showing an example of a photoelectric conversion device.

FIG. 9 shows the packaging state of a detector having 2,000×2,000 pixels. To obtain such detector with 2,000×2,000 pixels, the number of elements bounded in broken lines in FIG. 7 can be increased two-dimensionally. In this case, 2,000 control lines g1 to g2000, and 2,000 signal lines sig1 to sig2000 are required. Also, the shift register SR1 and the detection integrated circuit IC have a large scale since they must control and process 2,000 lines. When such elements are implemented using one-chip elements, one chip becomes very large, and is disadvantageous in terms of the yield, cost, and the like in the manufacture. In view of this problem, for example, the shift register SR1 is formed as one chip every 100 stages; 20 chips (SR1-1 to SR1-20) can be used. Also, the detection integrated circuit is formed as one chip for every 100 processing circuits; 20 chips (IC1 to IC20) can be used.

In FIG. 9, 20 chips (SR1-1 to SR1-20) are mounted on the left side (L), 20 chips are mounted on the lower side (D), and 100 control lines and 100 signal lines per chip are connected by wire bonding. A broken line portion in FIG. 9 corresponds to that in FIG. 7. Also, external connection lines are not shown. Furthermore, the switches SWr and SWs, the power supplies Vr and Vs, the circuit RF, and the like are not shown. The detection integrated circuits IC1 to IC20 generate 20 outputs (Vout). These outputs may be combined into one output via switches, or may be directly output and subjected to parallel processing.

The preferred embodiments of the present invention using the above-mentioned photoelectric conversion elements will be described in detail hereinafter with reference to the accompanying drawings.

[First Embodiment]

Figure 10:
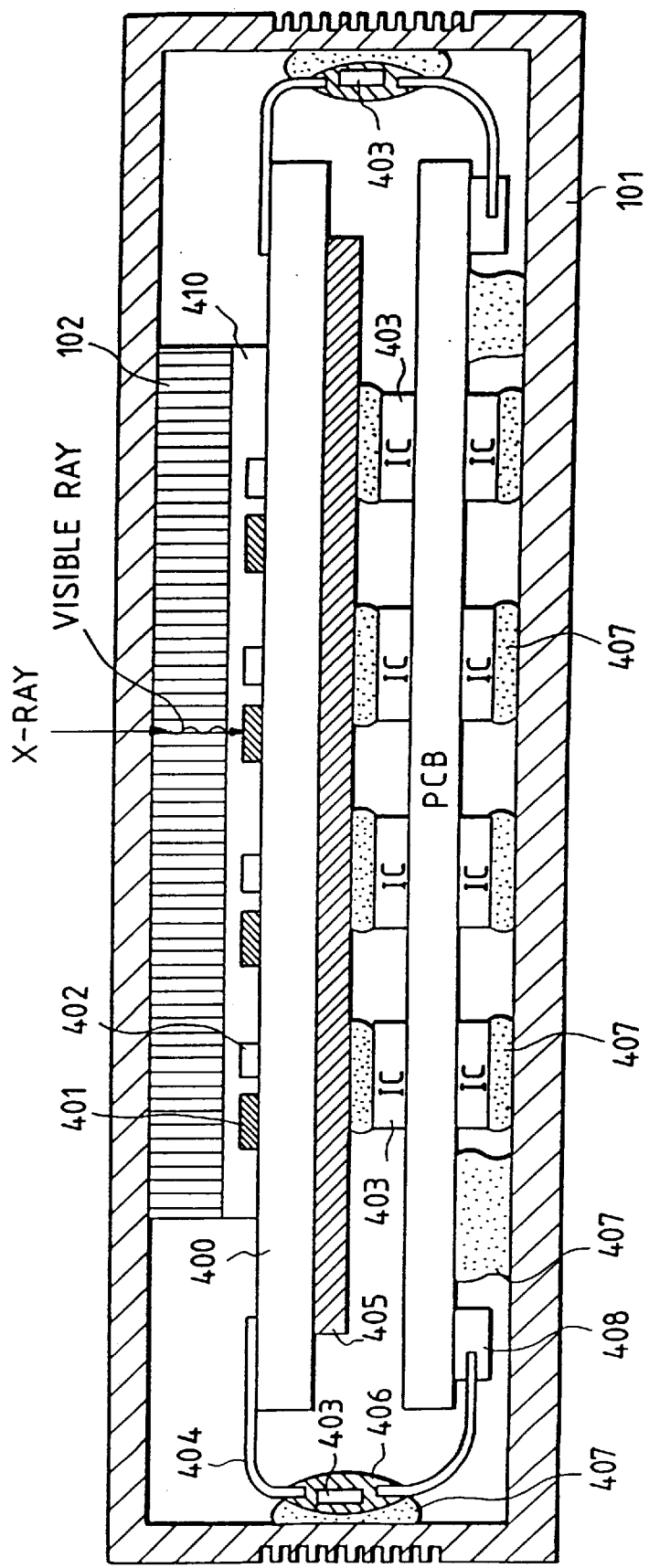
FIGS. 10 and 14 are sectional views for explaining an example of a photoelectric conversion device.
Figure 11:
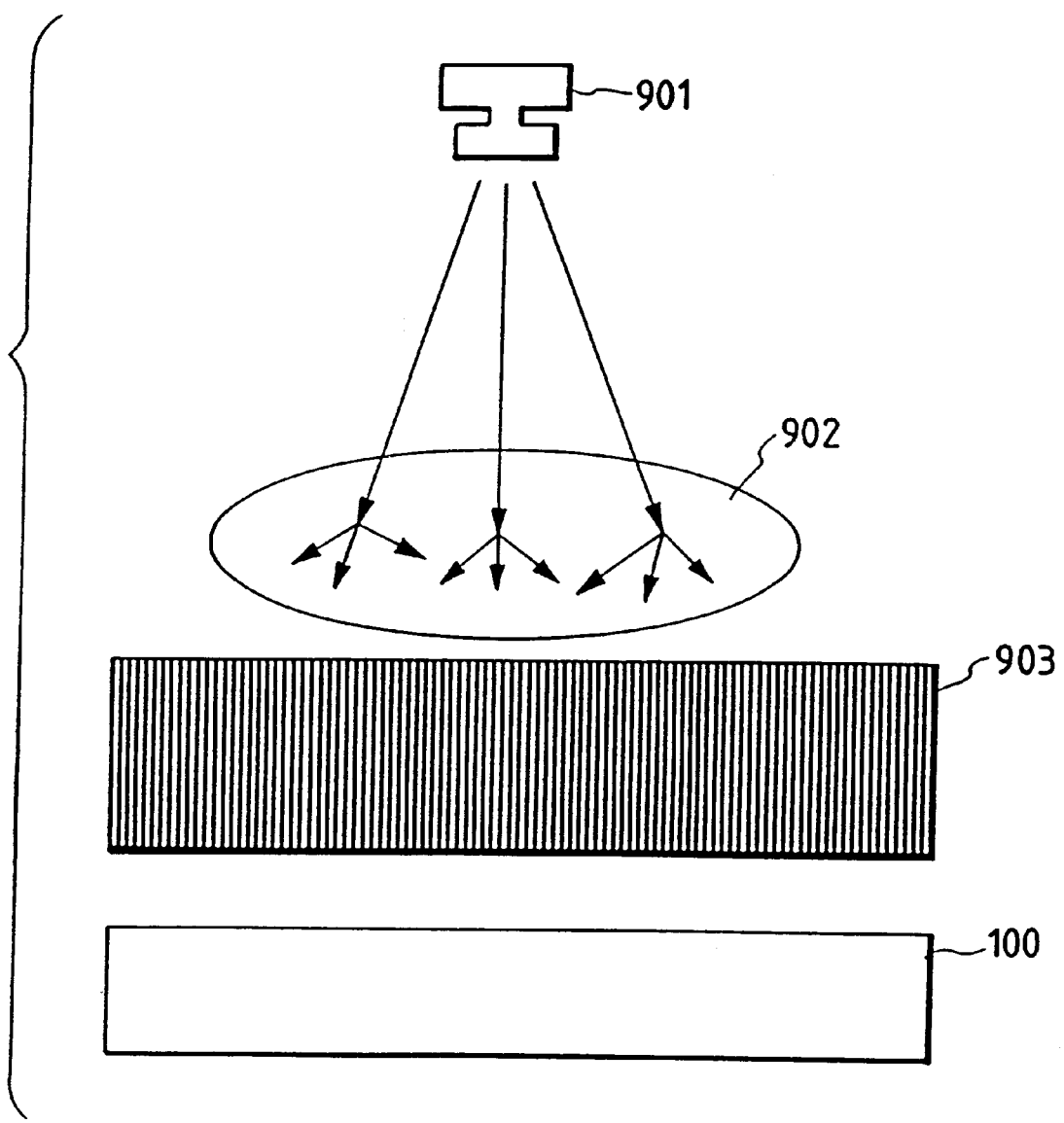

FIG. 10 is a sectional view of a photoelectric conversion device, according to the first embodiment of the present invention, which is suitably applied as that of an X-ray imaging apparatus. FIG. 11 is a schematic view showing an X-ray imaging apparatus including a photoelectric conversion device 100 shown in FIG. 10.

Referring to FIG. 11, X-rays from an X-ray source 901 are irradiated onto an object 902 to be inspected such as a human body or the like, and are subjected to absorption, transmission, and scattering in the object to be inspected depending on the substances in the body such as the lungs, bones, blood vessels, organs, and the like. The X-rays that have traversed the object to be inspected travel toward a grid 903.

Figure 12:
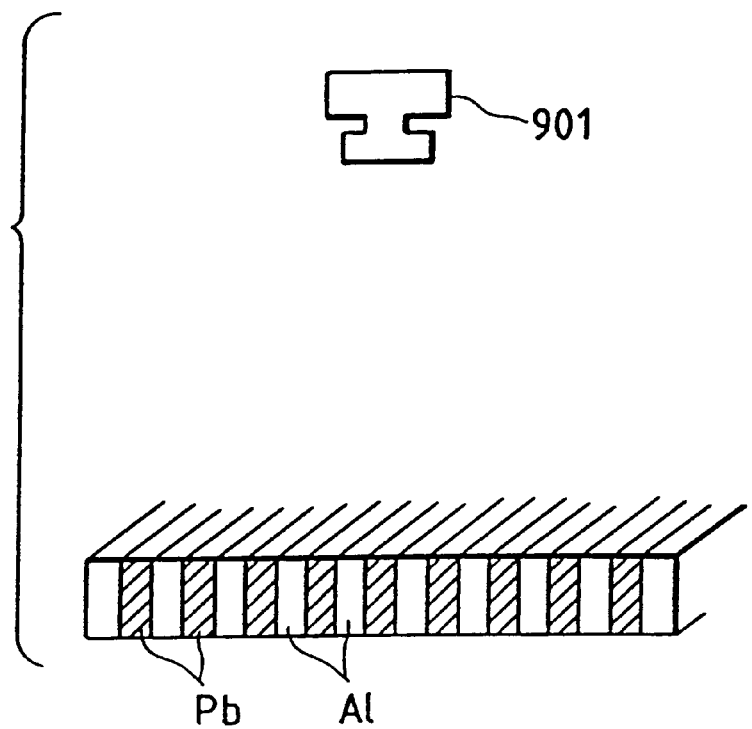
FIGS. 12 and 13 are partial sectional perspective views for explaining examples of a grid.
Figure 13:
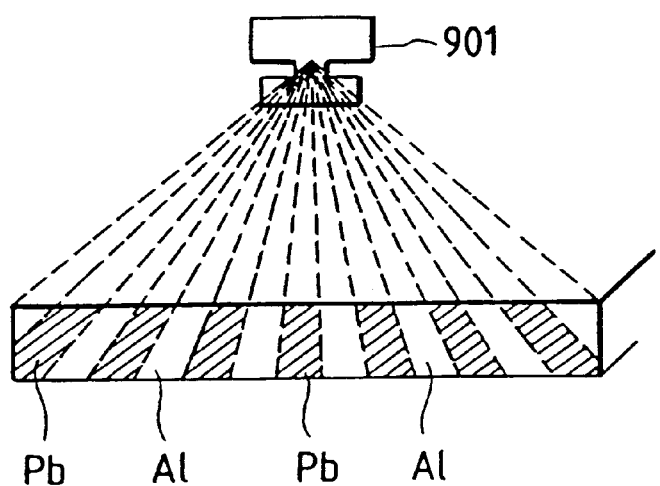

FIGS. 12 and 13 are sectional views showing the arrangement of the grid. The grid is constituted by alternately arranging a substance (e.g., lead) that absorbs X-rays, and a substance (e.g., aluminum) that transmit X-rays. The reason why the grid is arranged is to prevent a decrease in resolution due to X-rays scattered inside the object to be inspected. More specifically, only X-rays in a specific direction (the sectional direction of the grid) pass through the X-ray transmission substance portions (Al) and reach the photoelectric conversion device 100. On the other hand, X-rays scattered inside the object to be inspected are absorbed by the absorption substance portions (Pb) of the grid, and cannot reach the photoelectric conversion device 100.

FIG. 10 is a sectional view showing the internal structure of the photoelectric conversion device 100 of this embodiment. Referring to FIG. 10, an external chassis 101 serving as a housing of the photoelectric conversion device consists of a material (e.g., aluminum, a carbon material, or the like) that transmits X-rays, and X-rays containing X-ray information in the object to be inspected is irradiated onto a scintillator (phosphor) 102. The X-rays are excited (absorbed) by the phosphor in the scintillator, and the scintillator produces fluorescence having a wavelength in the spectral sensitivity wavelength range of photoelectric conversion elements 401.

As the material of the scintillator, CsI:Ta, $Gd_2O_2S$:Tb, $Y_2O_2S$:Eu, or the like is used.

Each photoelectric conversion element 401 photoelectrically converts fluorescence corresponding to an X-ray image from the scintillator 102, and a signal charge is transferred to a processing IC 403 via a switching element 402. The photoelectric conversion element 401 and the switching element 402 are formed on an insulating substrate 400, which is arranged beneath the scintillator 102 (on the side opposite to the X-ray source). A protection film 410 covers the elements 401 and 402 to protect them.

As can be seen from FIG. 10, the processing IC 403 is arranged in the vicinity of the photoelectric conversion element 401. This is to minimize adverse influences of external noise that are superposed on the wiring lines if the wiring lines are prolonged to transfer weak signal charges from the photoelectric conversion elements. The processing IC 403 has, e.g., functions of the reset switch element 805, reset power supply 807, capacitance 820, operational amplifier 821, switch 822, and switching element 825 in FIG. 5, is or corresponds to IC1 to IC20 in FIG. 9.

The processing IC 403 is mounted on a flexible cable 404. A signal from the processing IC 403 is supplied to ICs mounted on a PCB (printed circuit board; a circuit board manufactured by printing) via a connector 408. One of the ICs on the PCB is a high-speed A/D converter, which converts an input signal into digital data. After the signal is converted into digital data, the data is hardly influenced by external noise. As other ICs on the PCB, a memory (RAM) for temporarily storing digital data, a CPU for performing arithmetic processing of data, a nonvolatile memory (ROM) for storing a program, a line driver for transmitting data to a remote place at high speed, and the like are mounted.

These ICs mainly consist of crystalline Si, and their performances deteriorate upon irradiation of radiation such as X-rays having very high energy. In the worst case, the functions of these ICs may be completely lost.

A radiation absorbing member 405 is a shield member for shielding these ICs from radiation, and consists of a material (e.g., Pb) for absorbing X-rays. The member 405 is interposed between the insulating substrate 400 on which the photoelectric conversion elements 401 and the TFTs 402 are arranged, and the PCB on which the ICs are arranged. With this arrangement, fluorescence in the visible range from the scintillator 102 is irradiated onto the photoelectric conversion elements, and X-rays, which are not converted into visible rays by the scintillator (i.e., X-rays having traversed the scintillator), pass through the insulating substrate 400 but are absorbed by the Pb plate beneath the substrate 400. In this way, such X-rays never reach the ICs on the PCB.

When the Pb plate is arranged, as shown in FIG. 10, high reliability can be assured in X-ray resistance of the device.

Note that each processing IC 403 is arranged in the vicinity of the photoelectric conversion element to increase the external noise resistance (i.e., it is not arranged on the PCB). Since the processing IC 403 also consists of crystalline Si, a Pb member must be arranged around it if it is susceptible to X-ray radiation.

FIG. 10 shows an example when each processing IC 403 is covered by a radiation absorbing member such as a lead (Pb) member. If incoming X-rays do not reach the processing ICs 403 arranged around the photoelectric conversion elements (insulating substrate 400), the-lead members 406 can be omitted.

In FIG. 10, high-thermal conductive members 407 represented by, e.g., silicone-based grease having a high thermal conductivity contact the above-mentioned processing ICs 403, the ICs on the PCB, and the PCB itself. The thermal conductive members 407 also contact the radiation absorbing members 405 for absorbing X-rays or the Al chassis 101 that transmits X-rays.

With this arrangement, heat produced by the ICs mainly constituted by bipolar transistors, which are indispensable for processing information from a very large number of pixels at high speed, can be dissipated to metals such as Pb and Al having a high thermal conductivity. The silicone-based grease member that contacts the PCB also contributes to heat dissipation from the PCB.

As the wiring material of the PCB, Cu with a low resistance is normally used, and Cu is also excellent in thermal conductivity. Hence, the largest possible Cu solid pattern is formed on a region on the PCB, where ICs are not mounted and a silicone-based heat-dissipation grease member is arranged thereon, so that the surface, opposite to the PCB, of the grease member contacts Pb or Al, thus dissipating heat produced by the ICs via the PCB.

On the other hand, heat produced by the processing ICs 403 and the ICs on the PCB can be dissipated without using any thermal conductive members 407 such as silicone-based grease with a high thermal conductivity when they are in direct contact with the Pb plate or the Al chassis. Although the heat dissipation effect becomes slightly lower than that obtained when silicone-based grease is used, heat dissipation may be attained by making these ICs directly contact the Pb plate or Al chassis if heat produced by the ICs is not so large. Of course, in consideration of reliable thermal conduction, the thermal conductive members such as grease members are preferably interposed.

Depending on the distribution of heat produced by the ICs in a single X-ray imaging apparatus, heat produced by some ICs may be dissipated to Pb or Al via the silicone-based grease members and the remaining ICs may directly contact Pb or Al to dissipate their heat.

Note that the Al chassis can have a function of mechanically supporting the above-mentioned phosphor, insulating substrate, IC-mounted PCB, Pb plate, and the like in addition to the function of heat dissipation and the function of transmitting X-rays.

As the thermal conductive members 407 having a high thermal conductivity, a heat-dissipation adhesion tape having capton or aluminum as a base material may be used in addition to silicone-based grease.

More specifically, as the members 407 having a high thermal conductivity, heat-dissipation members such as heat-dissipation silicone rubber, a heat-dissipation single-sided adhesion tape, a heat-dissipation double-sided adhesion tape, a heat-dissipation adhesive, and the like may be used in addition to silicone-based grease.

As for heat dissipation using the silicone-based grease members, a heat-dissipation structure for mechanically supporting TCPs that package the ICs and Pb or Al may be adopted so as to stably fix the ICs to Pb or Al.

In order to improve thermal conductivity, silicone-based grease, heat-dissipation silicone rubber, and a heat-dissipation adhesive mixed with ceramics-based particles (e.g., aluminum oxide particles) are preferably used. Also, in order to improve mechanical strength, heat-dissipation silicone rubber mixed with glass cloth is preferably used.

As the heat-dissipation single-sided adhesion tape and heat-dissipation double-sided adhesion tape, an acrylic pressure sensitive adhesive tape containing ceramics-based particles (e.g., aluminum oxide particles) is available, and both a tape which uses a polyimide-based resin, aluminum, glass cloth, or the like as a base material, and a tape which is formed of an adhesive mass alone without using any base material may be used.

[Second Embodiment]

Figure 14:
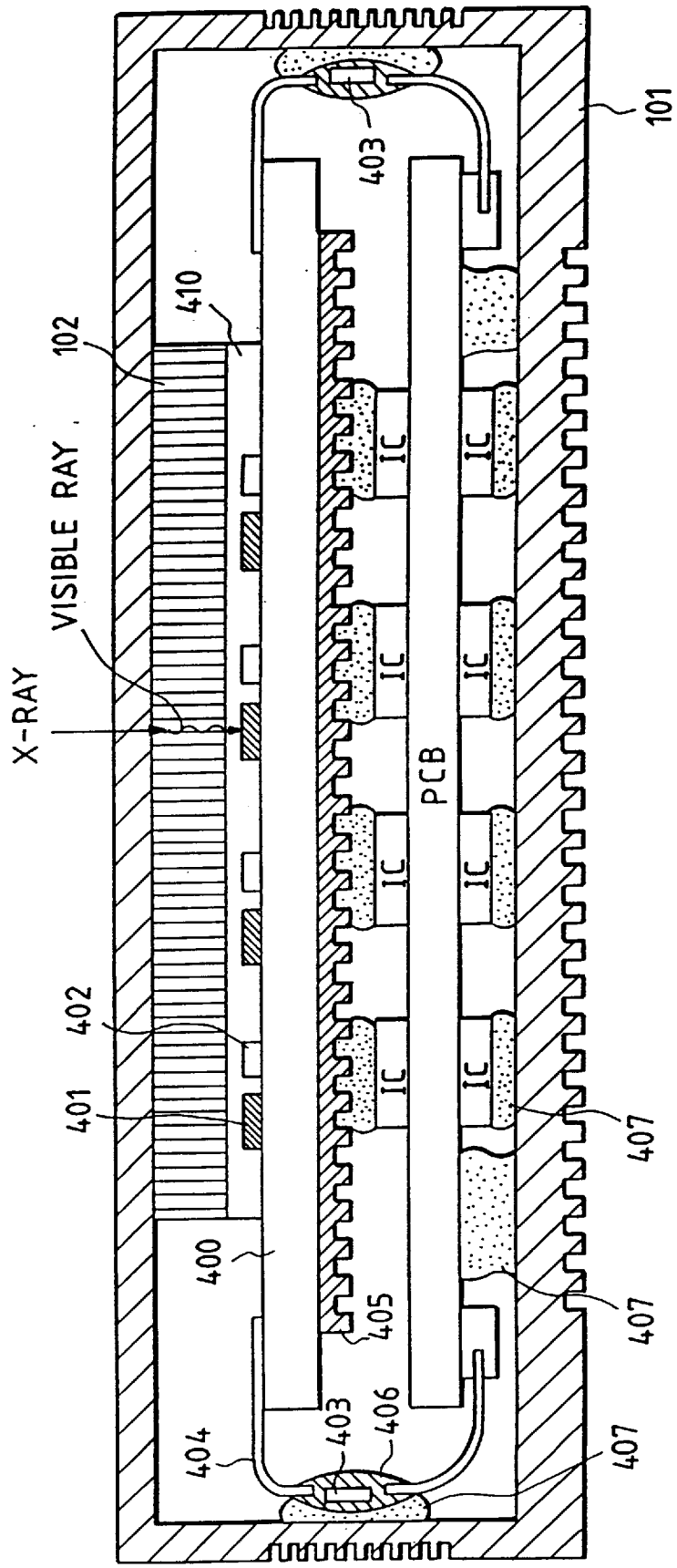

FIG. 14 is a sectional view of an X-ray imaging apparatus according to another embodiment of the present invention. The same reference numerals in FIG. 14 denote the same parts as in FIG. 10. Referring to FIG. 14, corrugations are intentionally formed on the outer surfaces of the Al chassis serving as the housing, and the surface of the Pb plate for shielding X-rays. With this structure, when heat produced by the ICs on the PCB and the processing ICs 403 is to be dissipated to the radiation absorbing member such as Pb or the heat-dissipation member such as the Al chassis via thermal conductive members consisting of, e.g., silicone-based grease, heat-dissipation silicon rubber, heat-dissipation single-sided adhesion tape, heat-dissipation double-sided adhesion tape, heat-dissipation adhesive, or the like, the contact area between the Pb and Al members and the air therearound increases, thus improving the heat-dissipation efficiency.

As for heat dissipation using the silicone-based grease members, a heat-dissipation structure for mechanically supporting TCPs that package the ICs and Pb or Al may be adopted so as to stably fix the ICs to Pb or Al.

The thermal conductive members in this embodiment can also be appropriately selected from thermal conductive members including various types of thermal conductive members described above.

Of course, as the thermal conductive members, the thermal conductivity and elasticity of metals such as copper, phosphor bronze, and the like, may be used, or such metals may be used in combination of the above-mentioned thermal conductive members.

If energy radiated from a light source including a radiation source (e.g., an X-ray source) can be directly sensed, the above-mentioned phosphor may be omitted, and another wavelength conversion member other than the phosphor may be used, needless to say.

In addition, when neither deterioration nor damage of peripheral circuits such as ICs upon radiation of high energy such as X-rays need be considered, the above-mentioned radiation absorbing member such as Pb need not be arranged.

(Effect)

As described above, according to the present invention, since heat produced by the ICs is dissipated to the radiation absorbing member such as a Pb plate or the chassis portion of, e.g., Al, to prevent excessive heat from being conducted to the photoelectric conversion elements and TFTS, or such heat is reduced to a negligible level if it is conducted, the problem of a low S/N ratio can be solved, and the reliability of the photoelectric conversion device and a system using the same can be further improved.

Also, according to the present invention, in the photoelectric conversion device having the ICs as peripheral circuits, the problem caused by adverse influences of heat produced by the ICs can be avoided or substantially avoided.

In addition, according to the present invention, since a high S/N ratio can be assured without increasing fixed pattern noise or random noise, high-quality read images can be provided for a long period of time or successively, and over a long term.

Furthermore, according to the present invention, the high S/N ratio of the photoelectric conversion element using an a-Si semiconductor thin film can be assured without increasing fixed pattern noise or random noise, and high-quality read images can be provided.

Since the photoelectric conversion device of the present invention can be one factor that realizes a digital X-ray diagnostic system including an X-ray imaging apparatus with a photoelectric conversion device, it can contribute to improvement in diagnostic efficiency in hospitals and in building inspections, and allows to build a world-wide diagnostic information network system in future.

Moreover, according to the present invention, "digitization of X-ray image information" strongly demanded in the medical industries in recent years can be realized, and not only the diagnostic efficiency in hospitals can be greatly improved but also a nation-wide medical diagnostic information network can be built. Accordingly, the diagnostic efficiency in the whole medical field can be improved. For example, a patient even in a remote place can undergo diagnosis as highly advanced as that he or she can receive only in a midtown university hospital.

What is claimed is:

1. A photoelectric conversion device comprising:
   a sensor substrate having a sensor formed on a surface thereof and having a metal plate provided on a side thereof opposite to the sensor-formed surface side;
   an IC provided on the metal plate via a thermal conductive member; and
   a chassis housing the sensor substrate, sensor, metal plate and IC therein.

2. The device according to claim 1, wherein the metal plate has an unevenness formed on a surface thereof.

3. The device according to claim 2, wherein the unevenness is formed on the side of the metal plate on which the IC is provided via the thermal conductive member.

4. A photoelectric conversion device comprising:
   a sensor substrate having a sensor formed thereon;
   an IC for processing a signal from the sensor; and
   a chassis housing the sensor substrate and the IC therein, wherein the IC is fixed via a thermal conductive member to the chassis, and wherein an unevenness for heat radiation is formed on a surface of the chassis.

* * * * *

UNITED STATES PATENT AND TRADEMARK OFFICE
CERTIFICATE OF CORRECTION

PATENT NO. : 6,049,074

DATED : April 11, 2000

INVENTOR(S): TADAO ENDO, ET AL.

It is certified that error appears in the above-identified patent and that said Letters Patent is hereby corrected as shown below:

COLUMN 1:
Line 19, "equipments" should read --equipment--.

COLUMN 2:
Line 55, "X-ray," should read --X-ray--.

COLUMN 11:
Line 59, "is" should be deleted.

COLUMN 12:
Line 50, "PCB," should read --PCB--.

Signed and Sealed this

Third Day of April, 2001

*Attest:*

NICHOLAS P. GODICI

*Attesting Officer*  Acting Director of the United States Patent and Trademark Office